United States Patent
Lee et al.

(10) Patent No.: US 6,871,698 B2
(45) Date of Patent: Mar. 29, 2005

(54) HEAT DISSIPATION DEVICE WITH INTERLOCKING FINS

(75) Inventors: Hsieh Kun Lee, Tu-Chen (TW); WanLin Xia, Shenzhen (CN); Jin Song Feng, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/748,809

(22) Filed: Dec. 29, 2003

(65) Prior Publication Data

US 2004/0194922 A1 Oct. 7, 2004

(30) Foreign Application Priority Data

Dec. 27, 2002 (TW) ..................................... 91221276 U

(51) Int. Cl.⁷ ................................................. F28F 3/04
(52) U.S. Cl. ..................................... 165/80.3; 361/704
(58) Field of Search ......................... 165/80.3, 78, 185; 361/704; 257/722

(56) References Cited

U.S. PATENT DOCUMENTS 5,886,873 A * 3/1999 Ahn ........................... 361/719
6,607,023 B2 * 8/2003 Ho et al. ...................... 165/78
6,644,386 B1 * 11/2003 Hsu ............................ 165/80.3
6,672,379 B1 * 1/2004 Wang et al. ................. 165/185

FOREIGN PATENT DOCUMENTS

| CN | 2386482 Y | 7/2000 |
|---|---|---|
| CN | 2415390 Y | 1/2001 |
| CN | 2487019 Y | 4/2002 |
| JP | 3094553 | 6/2003 |
| TW | 460110 | 10/2001 |
| TW | 526949 | 4/2003 |

* cited by examiner

Primary Examiner—Paul Hirsch
(74) Attorney, Agent, or Firm—Wei Te Chung

(57) ABSTRACT

A heat dissipation device (30) includes a base (50) and a plurality of individual fin plates (40) standing side by side on the base. Each fin plate includes a main body (41), a flange (43) and a pair of tabs (45) distal from the flange. Each tab defines a split (46) in a middle thereof where it adjoins the corresponding main body and thereby forms a tongue (47) surrounded on three sides by the split. The tongue is coplanar with the main body while the flange and the tabs are perpendicular to the main body. A slot (49) is defined in a distal end of each tab. The flanges of the fin plates are in alignment with each other and attached on the base. The slots of each fin plate receive the tongues of an adjoining preceding fin plate.

16 Claims, 2 Drawing Sheets

HEAT DISSIPATION DEVICE WITH INTERLOCKING FINS

BACKGROUND OF THE INVENTION

1. Field of the Invention

The present invention relates to heat dissipation devices for removing heat from electronic devices, and more particularly to a heat dissipation device including a plurality of individual fin plates that are interlocked together.

2. Description of Prior Art

Conventional heat dissipation devices used for removing heat from electronic devices are mostly formed by extrusion of metallic material. FIG. 4 shows an example of this kind of heat dissipation device. The heat dissipation device comprises a base, and a plurality of pins integrally extending from the base. The pins are relatively thick in comparison with distances defined between each two adjacent pins, due to inherent limitations in extrusion technology. This restricts the number of the pins that can be formed, and a total heat dissipation area that can be provided by the pins. Furthermore, a height of the pins is limited to about 13 times the distance between each two adjacent pins, also due to inherent limitations in extrusion technology.

With the continuing boom in electronics technology, numerous modern electronic devices such as central processing units (CPUs) of computers can operate at very high speeds and thus generate large amounts of heat. The heat must be efficiently removed from the CPU; otherwise, abnormal operation or damage may result. Conventional extruded heat dissipation devices are increasingly no longer able to adequately remove heat from these contemporary electronic devices.

In order to keep pace with these developments in electronics technology, assembled heat dissipation devices have been gaining in popularity. For example, China Patent No. 2462641Y provides an assembled heat dissipation device having a plurality of uniformly dimensioned individual plate fins evenly stacked together. Each fin forms top and bottom flanges. Each flange defines a pair of indents in communication with a main body of the fin, and forms a pair of tabs extending from outer peripheries of the indents respectively. The tabs of each fin are attached on the corresponding flanges of an adjacent fin in the indents. Thus, all the fins are connected together to form the heat dissipation device. However, the fins are connected together only by the attachment of the tabs of each fin in the indents of the adjacent fin. The fins are prone to be disengaged from each other when the heat dissipation device is subjected to shock or vibration during transportation or in operation. Part of or even the entire the stack of fins may collapse.

SUMMARY OF THE INVENTION

Accordingly, an object of the present invention is to provide a heat dissipation device including a plurality of individual fin plates that yield a relatively large total heat dissipation area.

Another object of the present invention is to provide a heat dissipation device including a plurality of individual fin plates attached together so that the heat dissipation device is stable and sturdy.

In order to achieve the objects set out above, a heat dissipation device in accordance with a preferred embodiment of the present invention comprises a base and a plurality of individual fin plates standing side by side on the base. Each fin plate includes a main body, a flange stamped therefrom and a pair of tabs distal from the flange. Each tab defines a split in a middle thereof where it adjoins the corresponding main body and thereby forms a tongue surrounded on three sides by the split. The tongue is coplanar with the fin plate while the flange and the tabs are perpendicular to the fin plate. A slot is defined in each tab adjacent a distal end thereof and isolated from the split. Each flange has a width substantially same as a distance from the tongue to the slot. The flanges of the fin plates are in alignment with each other and attached on the base. The slots of each fin plate receive the tongues of a corresponding adjoining preceding fin plate. The fin plates are formed by successively stamping a moving metal sheet.

Other objects, advantages and novel features of the present invention will become more apparent from the following detailed description when taken in conjunction with the accompanying drawings, in which:

DETAILED DESCRIPTION OF THE INVENTION

Figure 1:
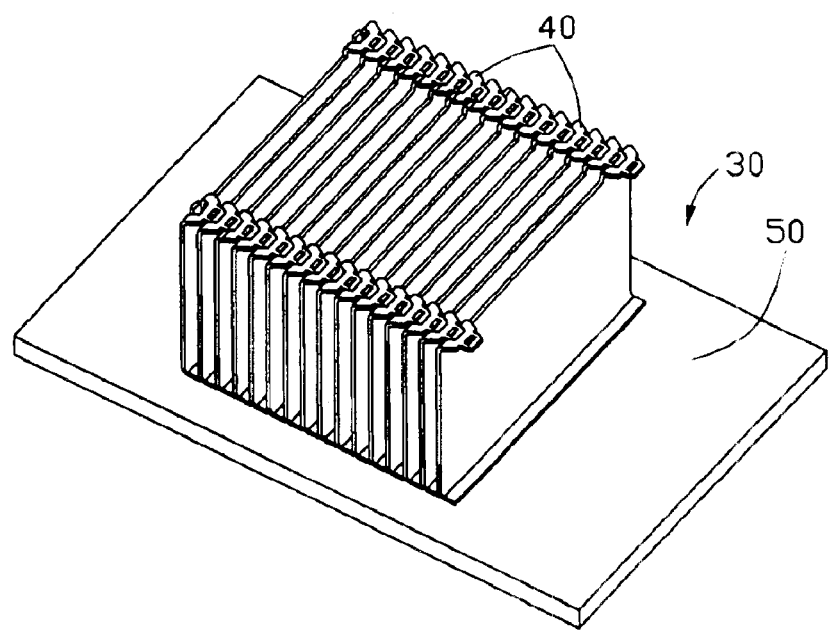
FIG. 1 is an isometric view of a heat dissipation device in accordance with the preferred embodiment of the present invention.
Figure 2:
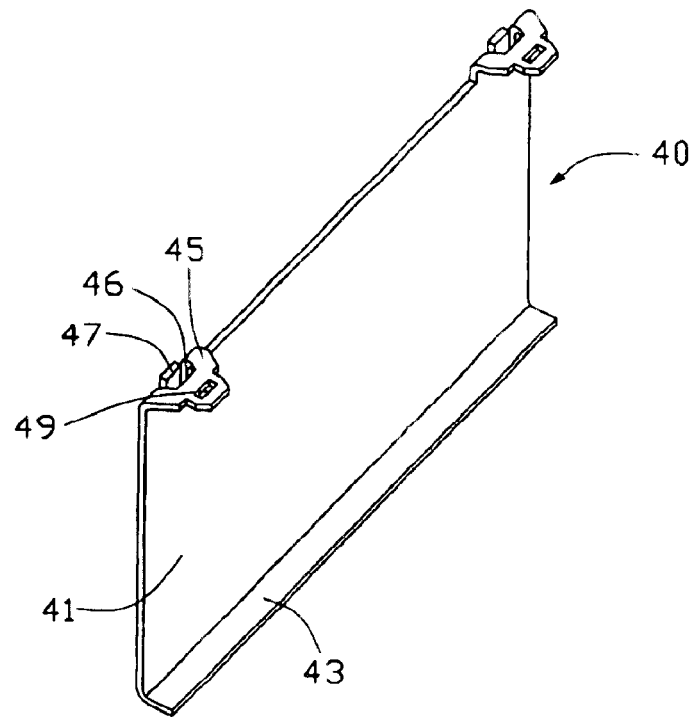
FIG. 2 is an isometric view of a fin plate of the heat dissipation device of FIG. 1.

Referring to FIGS. 1–2, a heat dissipation device 30 in accordance with the preferred embodiment of the present invention comprises a base 50, and a plurality of individual fin plates 40. Each fin plate 40 is metallic, and the fin plates 40 are formed by successively stamping a moving metal sheet. Each fin plate 40 has a main body 41. A pair of tabs 45 extends perpendicularly in a same direction from opposite sides of a top edge of the body 41 respectively. A split or opening 46 is defined in a middle of each tab 45 where it adjoins the body 41. A pair of tongues 47 is coplanarly formed on the top edge of the body 41 at the tabs 45 respectively, each tongue 47 being surrounded on three sides by a corresponding split 46. A slot 49 is defined in a distal end of each tab 45.

A flange 43 is perpendicularly bent from a bottom edge portion of the body 41, the flange 43 extending in said same direction and being parallel to the tabs 45. A width of the flange 43 is equal to a distance from each tongue 47 to its corresponding slot 49.

In assembly of the fin plates 40, the flange 43 of a first fin plate 40 is aligned with the flange 43 of an adjacent second fin plate 40. The body 41 of the second fin plate 40 is pressed toward the first fin plate 40, so that the slots 49 of the tabs 45 of the second fin plate 40 receive the tongues 47 of the first fin plate 40. Thus, the second fin plate 40 is attached to the first fin plate 40. In similar fashion, all the fin plates 40 are assembled together, with the flanges 43 thereof being coplanar with each other. Finally, this subassembly of fin plates 40 is mounted on a top surface of the base 50, with the flanges 43 in contact with the top surface. The heat dissipation device 30 is thus formed.

Figure 3:
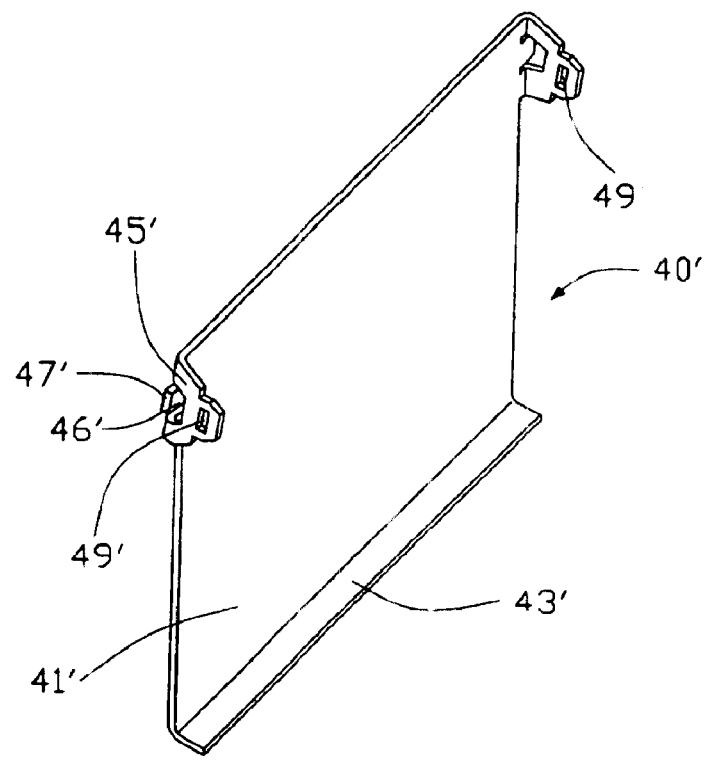
FIG. 3 is an isometric view of a fin of a heat dissipation device in accordance with an alternative embodiment of the present invention.
Figure 4:
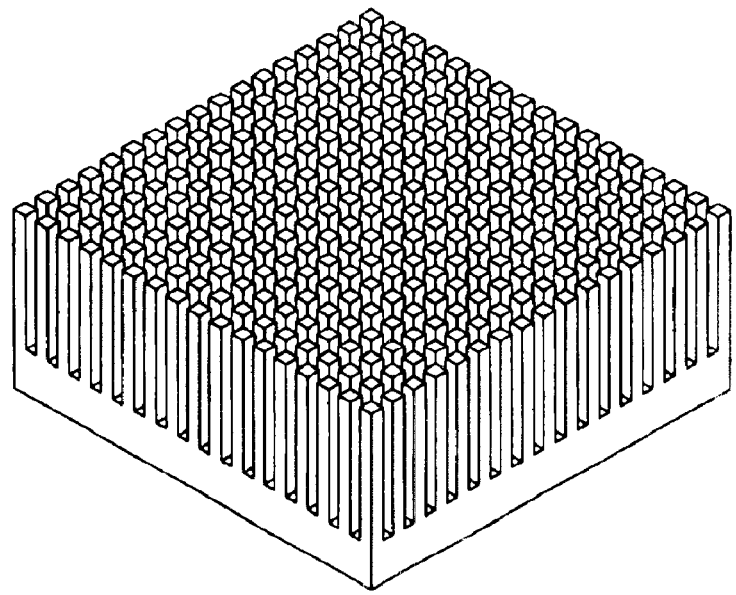
FIG. 4 is an isometric view of a conventional heat dissipation device.

FIG. 3 shows a fin plate 40' in accordance with the alternative embodiment of the present invention. The fin plate 40' is metallic, and a plurality of the fin plates 40' are formed by successively stamping a moving metal sheet. Each fin plate 40' has a main body 41'. A pair of tabs 45' extends perpendicularly in a same direction from respective opposite upper side edges of the main body 41'. A split 46' is defined in a middle of each tab 45' where it adjoins the body 41'. A pair of tongues 47' is coplanarly formed on the side edges of the body 41' at the tabs 45' respectively, each tongue 47' being surrounded on three sides by a corresponding split 46'. A slot 49' is defined in a distal end of each tab 45'. A flange 43' is perpendicularly bent from a bottom edge portion of the body 41', the flange 43' extending in said same direction and being perpendicular to the tabs 45'. Assembly of the fin plates 40' is similar to assembly of the fin plates 40 of the preferred embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:

a base; and a plurality of individual fin plates arranged side by side on the base, each of the fin plates comprising a flange attached on the base, and a pair of tabs perpendicularly formed from a main body of the fin plate and being distal from the flange, each of the tabs defining a split in a middle thereof where the tab adjoins the main body, a tongue being coplanarly formed with the main body thereat and being surrounded on three sides by the split, each of the tabs defining a slot in a distal end thereof;

wherein the flanges of the fin plates are in alignment with each other, and the slots of each fin plate engagingly receive the tongues of an adjacent fin plate.

2. The heat dissipation device of claim 1, wherein a width of the flange of each fin plate is equal to a distance from the tongue to the slot at each of the tabs.

3. The heat dissipation device of claim 1, wherein the flange is disposed at a bottom edge of the fin plate, and the tabs are disposed at an opposite top edge of the fin plate.

4. The heat dissipation device of claim 1, wherein the flange is disposed at a bottom edge of the fin plate, and the tabs are disposed at opposite side edges of the fin plate.

5. The heat dissipation device of claim 1, wherein the flange is perpendicular to the main body of the fin plate.

6. The heat dissipation device of claim 1, wherein the flange and the tabs extended in a same direction from the main body of the fin plate.

7. The heat dissipation device of claim 1, wherein each of the fin plates is metallic, and the fin plates are formed by successively stamping a moving metal sheet.

8. A heat dissipation device comprising:

a base; and a plurality of individual fins densely arranged side by side on the base with a space defined between every adjacent two fins, each of the fins comprising:

a planar main body extending in a longitudinal direction;

at least one tab angularly extending around one edge of the main body in a lateral direction;

an opening defined in the tab; and a tongue extending from proximate said edge in a direction essentially perpendicular to said lateral direction, and essentially located in said opening; wherein the tab includes a first section joined with the corresponding main body and structurally positioned in said space, and a second section extending from the first section and snugly received in the opening of the adjacent fin neighboring in said lateral direction.

9. The heat dissipation device of claim 8, wherein said second section further defines a slot to receive the tongue of said neighboring fin.

10. The heat dissipation device of claim 8, wherein said tongue extends in coplanar manner with the corresponding main body.

11. The heat dissipation device of claim 8, wherein said each of the fins comprises a flange attached on the base and far away from the corresponding tab.

12. The heat dissipation device of claim 11, wherein the flange complies with the space.

13. The heat dissipation device of claim 8, wherein said direction is perpendicular to said longitudinal direction.

14. A heat dissipation device comprising:

a base; and a plurality of individual fin plates arranged side by side on the base, at least one tab perpendicularly formed from a main body of the fin plate and defining a split in a middle thereof where the tab adjoins the main body, a tongue being coplanarly formed with the main body thereat and being surrounded on three sides by the split, each of the tabs defining a slot in a distal end thereof;

wherein the slot of each fin plate engagingly receives the corresponding tongue of an adjacent fin plate.

15. The heat dissipation device of claim 14, wherein a flange extends from an edge of the main body and is far away from the corresponding tab.

16. The heat dissipation device of claim 15, wherein said flange and said tab of each corresponding fin plate extend in a same lateral direction away from the corresponding fin plate.

* * * * *